United States Patent [19]

Singer et al.

[11] 3,971,989
[45] July 27, 1976

[54] METHOD AND SYSTEM FOR ABSOLUTE MEASUREMENT OF NOISE POWER AT ALL RADIO FREQUENCIES

[75] Inventors: Abraham Singer, Silver Spring; Jan M. Minkowski, Baltimore, both of Md.

[73] Assignee: The United States of America as represented by the Secretary of the Army, Washington, D.C.

[22] Filed: May 21, 1975

[21] Appl. No.: 579,644

[52] U.S. Cl. ............................. 325/363; 325/67
[51] Int. Cl.² ....................................... H04B 17/00
[58] Field of Search .................. 325/67, 133, 363; 324/57 N

[56] References Cited
UNITED STATES PATENTS

| | | |
|---|---|---|
| 3,317,826 | 5/1967 | Knop et al. .......................... 325/67 |
| 3,351,853 | 11/1967 | Wood ................................. 325/67 |
| 3,508,156 | 4/1970 | Webb ................................. 325/363 |
| 3,564,420 | 2/1971 | Webb ................................. 325/363 |

Primary Examiner—Robert L. Griffin
Assistant Examiner—Jin F. Ng
Attorney, Agent, or Firm—Nathan Edelberg; Robert P. Gibson; Saul Elbaum

[57] ABSTRACT

A method and system for absolute measurement of noise power is described. The method is valid at all radio frequencies but is particularly useful above 65 GHz where no other means for making such measurements currently exists. A gas driven shock tube is provided as a primary laboratory standard of high temperature and, hence, noise power. A system and method for comparing a noise source under test to the primary standard in order to provide an absolute measurement of noise power generated by the test source are described.

11 Claims, 3 Drawing Figures

METHOD AND SYSTEM FOR ABSOLUTE MEASUREMENT OF NOISE POWER AT ALL RADIO FREQUENCIES

RIGHTS OF THE GOVERNMENT

The invention described herein may be manufactured, used, and licensed by or for the United States Government for governmental purposes without the payment to us of any royalty thereon.

BACKGROUND OF INVENTION

The present invention relates to a system and method for the absolute measurement of noise power. More specifically, the present invention relates to a method and system for the absolute measurement of noise power utilizing a gas driven shock tube as a primary laboratory standard of high temperature and of power.

Every information-carrying signal is always competing with some noise which reduces the amount of information that can be transmitted with a given signal power. Since at carrier frequencies beyond about 1 GHz the receiver itself is the most prominent source of noise, an objective measure of the extent to which the receiver rf and i.f. stages degrade the signal to noise ratio would not only provide a means of determining the ultimate threshold sensitivity of the receiver but would also furnish an important criterion for comparing the relative performance of receiver front ends. The noise factor is the only figure of merit that meets this important requirement of objectivity. To make accurate noise factor measurements, we need, as a signal, broadband noise whose temperature is both accurately known and significantly different from the equivalent noise temperature of the receiver, referred to the input terminals. (Temperatures of the order of 10,000°K are sufficiently high for accurate noise factor measurements of most microwave receivers.) However, calibration of these noise sources has been one of the major problems in obtaining accurate measurements of noise factor. Existing techniques employ "hot-body noise sources" — such as a silicon-carbide wedge in a gold waveguide or a zinc-titanate wedge in a platinum 13-percent rhodium waveguide hermetically sealed and maintained at about 1300°K — as primary standards.

There are several disadvantages associated with these techniques. The main disadvantage is that they are inherently frequency limited, with the current upper limit being 65 GHz. This limitation is primarily due to the progressive difficulty of building a load that is well matched at relatively high temperatures as the dimensions of the waveguide become smaller and smaller. Two additional disadvantages arise from the requirement that the waveguide termination be kept hermetically sealed at about 1300°K, currently the highest practical temperature at which it can be maintained. First, this temperature is about an order of magnitude lower than the typical temperatures (10,000°K) of the commonly used noise sources. Generally, for ease and accuracy of the measurement, we want the temperature of the standard to be comparable with that of the device under calibration. Second, maintaining a hermetic seal at temperatures as high as 1300°K is not an easy task. In spite of the elaborate precautions that are taken to maintain that seal it is frequently found upon dissection of the load that an inorganic growth has formed in the waveguide and on the load, apparently as a result of some foreign matter that has leaked in. It is extremely difficult to determine the magnitude of the error that such growth introduces into the calibration system, even just prior to the dissection of the load. Thus, although these systems have theoretical accuracies of the order of 0.01 dB, we are never sure of the actual accuracy, and there is always the nagging doubt that a significant error — e.g., 3 dB — may be involved in the calibration. At any given time the actual accuracy can be ascertained only by dissecting and examining the termination — a very costly and time consuming process. A fourth disadvantage is that the standard as well as the associated measuring system is relatively delicate and direct calibrations against it are relatively difficult and cumbersome to make.

SUMMARY OF THE INVENTION

Accordingly, it is a primary object of the present invention to provide a method and system for the absolute measurement of noise power or temperature that surmounts all of the shortcomings of the prior art.

In keeping with this primary object it is a further object of the present invention to provide a method and system for measuring noise power which is not frequency limited and is useful at all radio frequencies.

It is still a further object of the present invention to provide a primary noise-power or temperature standard of the order of 10,000°K which increases with the radio frequency of interest.

The term radio frequency is used here in the sense it is defined by the IEEE — in "Standards on Wave Propagation: Definition of Terms," *Proc. IRE*, Nov. 1950; and in "Standards on Pulses: Definition of Terms, Part II," *Proc. IRE*, May 1952 — namely, as a frequency at which coherent electromagnetic radiation of energy is useful for communication purposes.

The objects of the present invention are fulfilled by utilizing a gas excited shock tube as a primary laboratory standard of high temperature or of noise power. A microwave measuring system is provided for comparing the noise power generated by the primary standard and the noise source under test. The measuring system employs superheterodyning for measuring low level signals.

A method and system are disclosed for determining the degree of mismatch between the microwave measuring system and the plasma in the shock tube. This degree of mismatch is taken into account in calculating the absolute noise power generated by the noise source under test.

BRIEF DESCRIPTION OF THE DRAWINGS

The objects of the present invention and the attendant advantage thereof will become more readily apparent by reference to the following description of the drawings wherein.

DETAILED DESCRIPTION OF DRAWINGS

Some of the major work in shock-wave theory has been done over half a century ago. It has been shown that the shock front, or the region separating the equilibrium undisturbed gas from the equilibrium shocked gas, can be frequently treated as a mathematical discontinuity in that it provides a stable transition between the two states, although it may not necessarily always be thin. The shock front is stable in the sense that it does not change its shape as it propagates. Typically, its thickness is several mean free paths of the undisturbed gas. In this transition region the gas flow velocity, temperature, and density undergo drastic changes. The laws of conservation of energy, momentum and mass apply, of course, on both sides of the shock front.

An important special case of shock waves is the plane shock wave. Its distinguishing feature is that the plane containing the pressure discontinuity is normal to the direction of propagation. It is of great practical interest both because it can be readily obtained in the laboratory and because of the relative ease with which some of its properties may be handled mathematically. Quite frequently plane shock waves are generated by allowing a gas at high pressure to expand suddenly into a straight channel of uniform cross section containing a gas at much lower pressure, and considering the shock wave only after it has traveled a distance greater than several diameters of that channel. A good example of a device for generating such shock waves is the shock tube.

The shock tube is a very versatile instrument of research in physics, chemistry, and related engineering fields primarily because its shock parameters can be calculated very accurately and because the products resulting from the shock wave action are relatively very homogeneous and pure.

Shock tubes are sometimes categorized according to the type of driver they employ, namely, as electrically driven or gas driven. There are several versions of the electrically driven tube. All, however, employ a condenser bank that is discharged in a direction perpendicular to the axis of the tube to achieve gas breakdown and initiate the shock, usually near one end of the tube. Although the velocity of the fastest shock front depends on the capacitor voltage of that bank, the shock motion itself is determined by electron pressure. Some versions, such as the T-tube and gas discharge machine "Midge," employ the magnetic field of a strap current to manipulate the direction of the main discharge current. In addition, an external magnetic field is sometimes used to reinforce the field of the strap current in the T-tube. Since a significant fraction of the ionization in the electrically driven shock tube is produced by photo-ionization, there is considerable doubt whether the gas is in thermal equilibrium. Thus the usefulness of the results obtained by this type of tube is severely limited. We therefore prefer to use gas-driven tubes in practicing the present invention.

Figure 1:
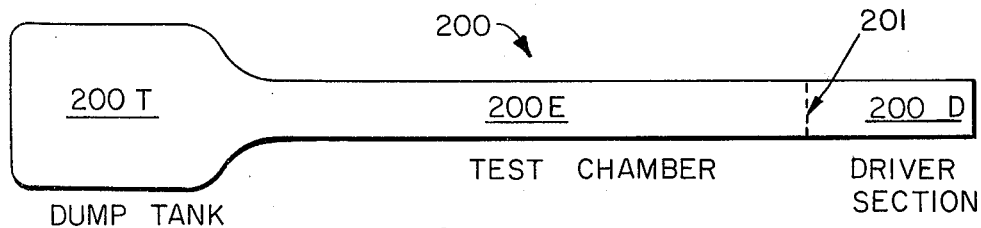
FIG. 1 is a diagrammatic view of a shock tube suitable for use in the present invention.

Referring in detail to FIG. 1 there is illustrated a gas driven shock tube 200 for use in the system and method of the present invention. The gas-driven shock tube 200 consists basically of two sections separated by a plastic or metal diaphram 201. An expansion channel 200E is usually the longer section, its minimum length being equal to several diameters of the tube (to permit the formation of a plane shock front) plus enough length for the desired observation stations. It is usually terminated in either a dump tank 200T or a blank end plate. The length of the driver section 200D is about one-fourth that of the expansion channel and is usually made of steel which can withstand very high pressure.

After deciding on a test gas to be contained in expansion chamber 200E, one selects a suitable driver gas for driver section 200D. The expansion chamber 200E is then "rinsed" by pumping down both the test and driver sections to a very low level (e.g., $10^{-3}$ torr), shutting off the driver section 200D, pumping up the test gas in expansion chamber 200E to a pressure about an order of magnitude higher than that at which it will be shocked, and then pumped up again to the high level and quickly pumped down to the required level; and the gas in the driver section 200D is then pumped up until the diaphram 201 bursts.

Since relatively very pure gases (e.g., 99.99 percent) can frequently be readily obtained, the final impurity in the test gas is determined primarily by the leak rate of the shock tube and by how quickly the test chamber is rinsed. Purities of about 99.8 percent are frequently quite readily obtained.

For a given driver gas and a given test gas at a specified initial temperature and pressure, the diaphram bursting pressure determines the shock level. Thus the shock level may be controlled by varying the diaphram thickness as well as the material from which it is made. For a given diaphram, however, the shock Mach number may be conveniently varied by employing mixtures of gases as the driver gas. Thus if Mach number $M_A$ is obtained by using gas A as a driver and Mach number $M_B$ is obtained by using gas B as a driver, any value between $M_A$ and $M_B$ may be obtained by an appropriate mixture of A and B. Furthermore, very high shock levels may be achieved by using hot driver gas, obtained by igniting combustion mixtures such as oxygen and hydrogen, with a single driver section or with multiple sections separated by auxiliary diaphrams.

Figure 2B:
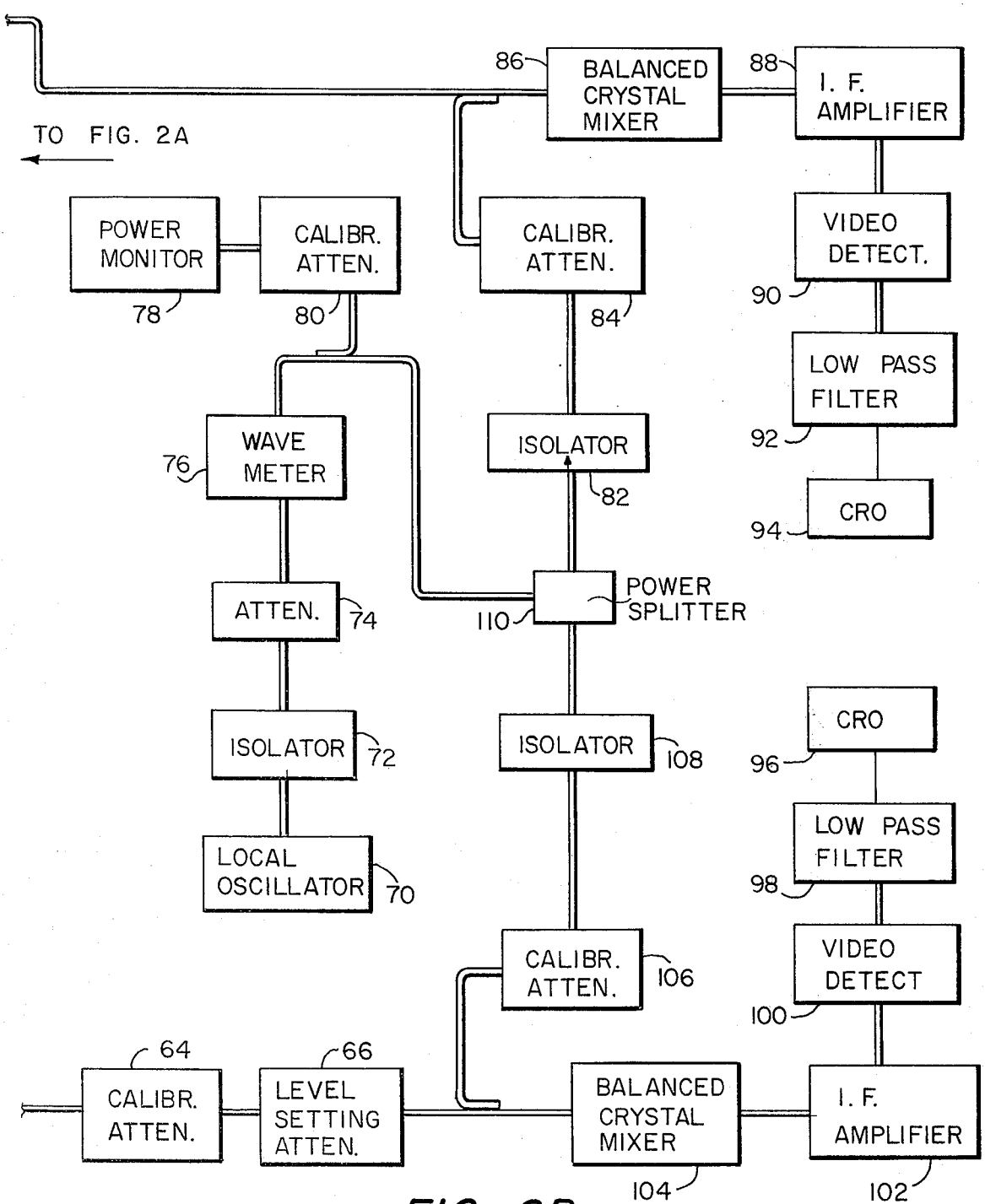
FIGS. 2A and 2B are schematic diagrams of a system for measuring noise power or temperature utilizing the shock tube of FIG. 1.
Figure 2A:
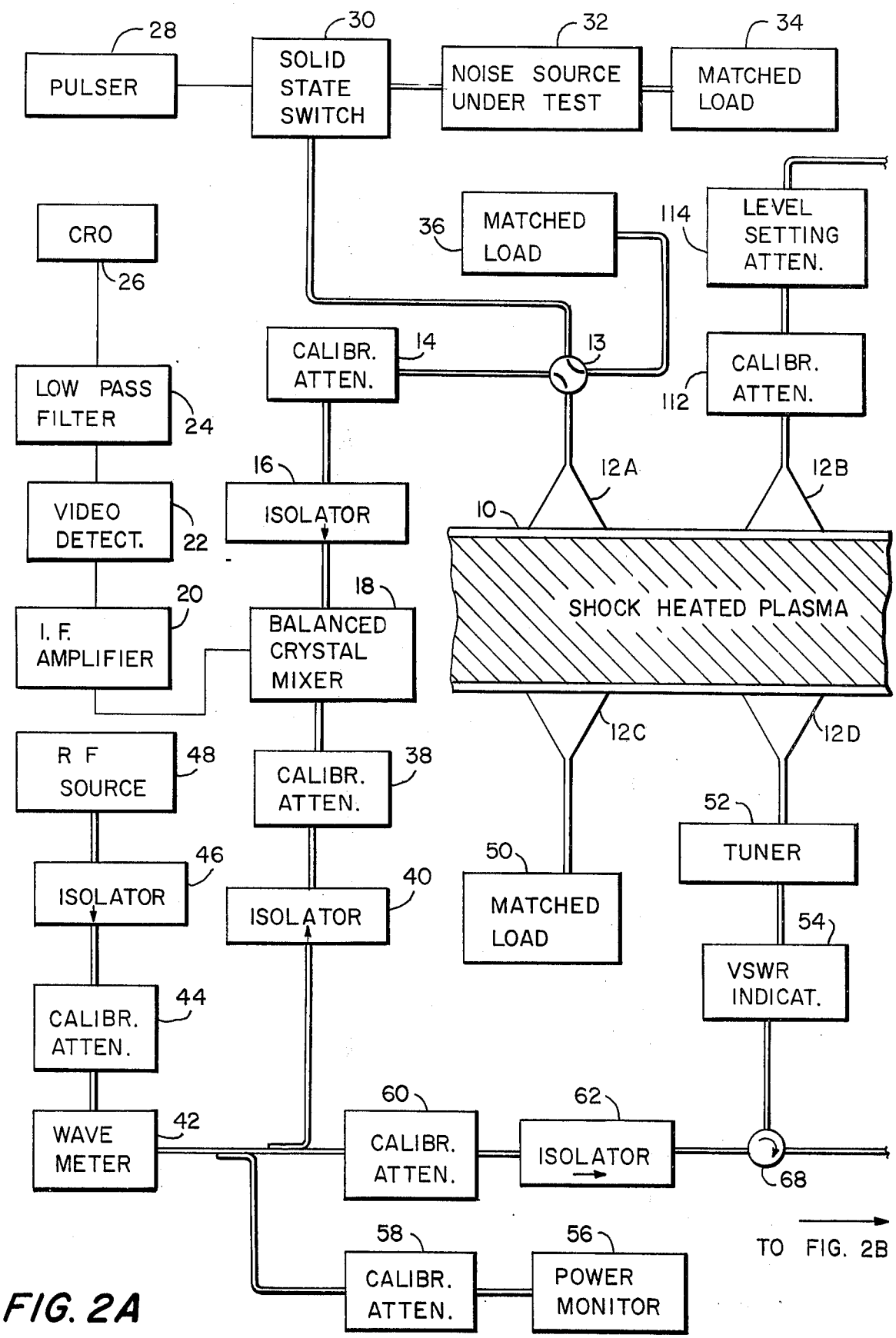

Referring in detail to FIGS. 2A and 2B there is illustrated a system and method for measuring noise power utilizing a shock tube of the type illustrated in FIG. 1.

An observation section 10 is inserted between the expansion chamber 200E, and dump tank 200T, of the gas-driven shock tube. Section 10 is of sufficient length to accommodate two sets of microwave horns or antennas 12A, 12B, 12C, 12D at the rf of interest. The thickness of the walls of observation section 10 should be a convenient multiple of ½ wavelength, and should be made of a dielectric material having a relatively low loss at the rf of interest, but strong enough to withstand the necessary shock levels.

The horns 12A, 12B, 12C, 12D are positioned so that their wide dimension is parallel to the axis of the tube. The axis of each set of horns may be inclined at an angle other than 90° with the axis of the tube to improve the match between the microwave measuring system and the plasma viewed in the observation section. When this is done, one must make sure that both sets are inclined at the same angle and that the observation section 10 is long enough to accommodate this arrangement.

The taper of the horns should be gradual enough to minimize reflections from the wall of the observation section. To minimize the diffraction effect, the wide dimension of the horns should be several wavelengths wide. An E-H or stub tuner 52 could be used to reduce the mismatch introduced by the observation section to an acceptable level.

For example the system can be calibrated before introducing plasma into observation section 10 by connecting a stub tuner 52 to horn 12D, probing the observation section with an RF pulse from source 48 and adjusting tuner 52 until VSWR indicator 54 indicates a voltage standing wave ratio of less than 1.1.

Once the apparatus is set and appropriate adjustments have been made, the loss in the observation section, including the loss in the horns and tuners, is measured in any suitable manner.

The shock Mach number of shock tube 200 is measured in a convenient way (not shown). One way is to locate three timing probe stations say 10 inches apart (measure this distance very accurately) near the observation section and place at each probe a convenient sensing device, such as a film resistor having a satisfactory thermal response, that generates a voltage upon arrival of the shock front. The signal from the first timing probe, after appropriate processing (e.g., amplifying and differentiating), is used to trigger a counter. The signal from the second timing probe (after processing, if necessary) is used to stop that counter and to trigger another counter. Similarly, the signal from the third probe is used to stop the second counter. These data enable the computation of the shock velocity very accurately. (The function of the third timing probe and second counter is of course to provide a check on the measurement.)

Another way of measuring the shock Mach number might be by means of a microwave Doppler system.

The dump tank of tube 200 would be replaced by a section of shock tube several feet long. A waveguide probe about five wavelengths long would be introduced into the end of that section so that its axis coincides with that of the tube. The other end of the probe would be connected to a convenient microwave superheterodyne system capable of measuring Doppler frequencies corresponding to the range of Mach numbers of interest. The end of the probe would be closed off with a low-loss dielectric material one or more half wavelengths thick to form a microwave transparent window. As the shock wave moved down the tube, a low-level microwave signal, transmitted via the probe, would impinge on the plasma and the reflections measured by means of the superheterodyne system; the Doppler frequency is obtained, and from it, the shock velocity.

A convenient monatomic test gas (e.g., argon), a driver gas (e.g., helium), and convenient values of initial temperature and pressure for the test gas are chosen for use in shock tube 200 of the present invention. A value for the shock level is selected so that the plasma frequency of the shock heated gas in equilibrium is between about two and five times the center radio frequency of interest, $f$, i.e., so that the electron density, $n_e$, in $m^{-3}$, is $$0.06\ f^2 < n_e < 0.3\ f^2 \qquad (1)$$

This is an important step. The lower bound ensures that the microwave measurements can be made in a relatively simple manner. The upper bound ensures that the sidewall shocktube plasma boundary layer exerts a negligible effect on the measurement. In addition, but not quite as important as the first two reasons, both bounds ensure a fairly good match between the observation section and plasma so that the magnitudes of the reflection and diffraction coefficients of the plasma are small, making the experimentally determined electron temperature relatively immune even to fairly large errors in the measured reflection and diffraction coefficients.

The shock level is adjusted so that the electron density, $n_e$, of the shock-heated plasma in equilibrium is say $0.15\ f^2$. Five equations are set up consisting of Saha's equation (see for example, J. K. Wright, *Shock Tubes*, Metheun and Co., Ltd., London, 1961), for the degree of ionization of the shock heated gas in terms of the equilibrium temperature and pressure behind the shock front and of the laws of conservation of energy, momentum and mass for the equilibrium undisturbed gas (ahead of the shock front) and the equilibrium shocked gas behind the shock front, viz., $$\rho_r = \frac{\gamma + 1}{\left[\gamma + \frac{1}{M_s^2}\right] - \left\{\left[1 - \frac{1}{M_s^2}\right]^2 + \left[\gamma - \frac{1}{\gamma}\right]\frac{2\delta I}{kt_1 M_s^2}\right\}^{1/2}} \qquad (2)$$

$$p_r = \frac{1 + \left[\frac{2\delta I}{kt_1} - \frac{\gamma+1}{\gamma-1}\right]\rho_r}{\rho_r - \left[\frac{\gamma+1}{\gamma-1}\right]} \qquad (3)$$

$$t_r = \frac{1}{1+\delta}\frac{p_r}{\rho_r} \qquad (4)$$

$$\delta = \left\{1 + \frac{Cp_1 p_r e^{I1/kt_r}}{kt_1^{5/2} t_r^{5/2}}\right\}^{-1/2} \qquad (5)$$

$$n_e = 7.35 \times 10^{21}\frac{\delta \rho_r p_1}{t_1} \qquad (6)$$

where, $M_s$ is the shock Mach number, relative to the undisturbed gas; subscripts 1 and 1 represent the thermodynamic states of the gas in front of and behind the shock front; $P_1$ and $P_2$, the two pressures; $t_1$ and $t_2$, the two temperatures, $\rho_1$ and $\rho_2$, the two densities; the subscript r designates the ratio of the two states, e.g., $t_r = t_2/t_1$; $\delta$ is the degree of ionization; $n_e$ is the electron density (in cm$^{-3}$); $\gamma$ is the ratio of specific heats (equal to 1.667 for argon); I is the ionization potential (equal to 15.76 eV for argon); $k$ is Boltzmann's constant; C is a constant (equal to $2.54 \times 10^5$ cm-sec$^2$(°K)$^{5/2\sigma-1}$ for argon).

These five equations, (2) to (6), are solved by first assuming the degree of ionization to be zero to obtain the ratios of density, pressure, and temperature of the gas behind the shock front to those of the undisturbed gas in front of the shock front; these values are used to get a second approximation of the degree of ionization, and this iteration is continued until the new value for the degree of ionization differs from the previous one by a negligible amount.

The expansion channel 200E of shock tube 200 is rinsed, following the procedure outlined with reference to FIG. 1, and a shock wave is generated using a suitable diaphram and driver gas under appropriate pressure. The shock level is accurately measured by one of the procedures previously described, and the actual electron density is computed. If the density is outside the required ranged (0.06 to 0.3f²), the shock level is readjusted to bring the density into this region.

The plasma in shock tube 200 must be thick enough so that the magnitude of the transmission coefficient T, viz., the fraction of an incident probing signal from horn 12D transmitted through the plasma, is negligibly small. This is accomplished as follows: T is usually defined as $$T = (1-R)e^{-\alpha L} \qquad (7)$$

where $R$ is the power reflection coefficient, $\alpha$ is the power absorption per unit distance, and $L$ is the effective plasma thickness. In the experimental setup illustrated in FIGS. 2A and 2B, the absorption per unit distance is very close to that of an infinitely large plasma and may therefore be approximated by $$\alpha = \sqrt{2} \; \frac{\omega}{c} \left\{ -\left(1 - \frac{(\omega_p/\omega)^2}{1+(\nu/\omega)^2}\right) + \left[\left(1 - \frac{(\omega_p/\omega)^2}{1+(\nu/\omega)^2}\right)^2 + \left(\frac{\nu/\omega(\nu_p/\omega)^2}{1+(\nu/\omega)^2}\right)^2\right]^{1/2} \right\}^{1/2} \qquad (8)$$

where $\omega$ is the radian frequency under consideration, $c$ is the speed of light, $\nu$ is the electron collision frequency; and $\omega_p$ is the electron plasma frequency given by $\omega^2_p = n_e e^2/m\epsilon_0$, with $n_e$ the plasma electron number density, $e$ the electronic charge, $m$ the electronic mass, and $\epsilon_0$ the permittivity of free space. In many cases the electron collision frequency may be approximated by $$\nu = 3.62 \times 10^{-6} \; \frac{n_i}{t_e^{3/2}} \ln\left(1.23 \times 10^7 \; \frac{t_e^{3/2}}{n_e^{1/2}}\right) + 2.6 \times 10^4 \sigma^2 n_n t_e^{1/2} \qquad (9)$$

where $n_i$, $n_e$, and $n_n$ are the ion, electron and neutral densities (per cubic meter), respectively; $t_e$ is the electron plasma temperature in kelvin; and $\sigma$ is the collision diameter (in meters) for electron-neutral collisions. $n_i = n_e$, and $n_e$ was computed earlier; $\sigma$ for the particular gas in question can be readily found in an engineering or physics handbook; and the procedure for obtaining $t_e$ will be described later on.

To get a conservative estimate of the transmission coefficient T, R is set equal to zero, and L is taken to be the side of a square that can be inscribed in the cross section of the shock tube; if T does not meet the condition T<<1, a thicker shock tube is used. This ensures that the signal measured behind the plasma by horn 12B is due to diffraction only, and thus the electron plasma temperature can be readily computed by use of an appropriate plasma model (Eq. 10).

Referring in further detail to FIGS. 2A and 2B horn 12A is positioned adjacent the wall of tube 200 at observation section 10 to measure the noise power of the shock wave. The measured noise power detected by horn 12A is directed by a first position of switch 13 to cathode ray oscilloscope 26 on which a pulse representative of measured noise power in tube 200 is displayed. Cathode Ray Oscilloscope (CRO) 26 may for example comprise a memory oscilloscope of a type known in the art on which the noise pulse detected by horn 12A is stored on the screen for future comparison, as will be described hereinafter. In the alternative the noise pulse on the screen can be photographed.

Included in the signal path between horn 12A and CRO 26 is a calibrated attenuator 14, an isolator 16, balanced crystal mixer 18, I.F. amplifier 20, video detector 22, and low pass filter 24. Also coupled to the mixer 18 is a superheterodyne system including R.F. source 48, isolator 46, calibrated attenuator 44, wave meter 42, isolator 40, and calibrated attenuator 38. The specifics of the superheterodyne system form no part of the present invention, all of the components thereof being well known components which are used by those skilled in the microwave art. The general purpose of the superheterodyne system is to permit the measurement of low level signals by horn 12A in a manner known in the art.

After a noise power signal is detected by horn 12A and stored on the screen of CRO 26 as a noise power standard, switch 13 is switched to a second position to couple the noise source 32 under test through the same path as horn 12A to CRO 26. By means of pulser 28 and solid state switch 30 a noise pulse from source 32 is applied to the screen of CRO 26 which is compared with the noise pulse standard detected in shock tube 200 by horn 12A. The pulser 28 and solid state switch 30 function to create a noise source 32 which is identical in width and shape to the standard noise pulse previously stored. However, the amplitudes of the two pulses are different. By adjusting calibrated attenuator 14 the noise pulse on the screen of CRO 26, which represents the noise source under test can be adjusted to also correspond in amplitude to the standard noise pulse generated by shock tube 200.

The microwave circuit including the noise source 32 is provided with matched loads 34 and 36 for reasons known in the art. A matched load 50 is coupled to horn 12C for similar reasons.

Accordingly, the degree of adjustment necessary by calibrated attenuator 14 to create a match in amplitude between the noise pulse from noise source 32 and the noise pulse from shock tube 200, is a measure of the actual noise power of source 32 under test. At least this is theoretically true because the noise power generated from shock tube 200 can be accurately predicted, as discussed hereinbefore.

However, due to a mismatch between the microwave detection system including horns 12A, 12B, 12C, 12D and observation section 10 and the plasma in shock tube 200, the noise power actually detected or measured by horn 12A does not in fact correspond to that predictable by theory. Applicants, have discovered that the degree of mismatch can be determined by measuring the diffraction and reflection coefficients $T_D$ and R, respectively, of the plasma in shock tube 200 in response to an R.F. probe pulse introduced into the plasma from R.F. source 48 via horn 12D. After the diffraction and reflection coefficients $T_D$ and R are measured the actual noise power of noise source 32 can be calculated from the respective coefficients in conjunction with the degree of adjustment of calibrated attenuator 14 necessary to match the test and standard pulses on the screen of CRO 26.

The electron temperature $t_n$ or noise power of the noise source 32 is computed from the equation.

$$t_n = Q \left[ \frac{1 - R - T_D}{1 - T_D} t_e + T_D t_L \right] \qquad (10)$$

where $R$ and $T_D$ have been defined earlier; $t_e = t_2$ is the electron temperature of the equilibrium plasma, obtained from equations (1) to (5), $t_L$ is the temperature of the load behind the plasma (usually room temperature); and Q is the ratio of the attenuation in the path between the shock tube 200 and microwave receiver CRO 26 is the attenuation in the path between the noise source 32 and the receiver CRO 26, expressed as a numeric. The ratio Q being determined by the degree of adjustment of the calibrated attenuator 14.

The systems for measuring the diffraction coefficient $T_D$ and reflection coefficient R are illustrated by further reference to FIG. 2A and 2B. As illustrated therein there is provided an R.F. source 48. A signal path is provided from R.F. source 48 to horn 12D via isolator 46, calibrated attenuator 60, isolator 62, circulator 68, VSWR indicator 54, and stub tuner 52. The R.F. signal supplied to horn 12D is used as a probing signal which is introduced into the plasma in shock tube 200. As stated hereinbefore if the plasma is properly chosen there will be substantially no transmission of the probe signal through the plasma into horn 12B. However, a portion of the probe signal will be reflected into horn 12D and a portion will be diffracted around the plasma and detected by horn 12B. By measuring these respective portions, the reflection and diffraction coefficients R and $T_D$ can be determined.

The circulator 68 as is well known in the part permits signals to be selectively directed along different paths. In the present invention circulator 68 permits the incident R.F. probe signal to pass from isolator 62 to horn 12D and the reflected probe signal to pass from horn 12D to calibrated attenuator 64 in a reflection coefficient measuring circuit to be described. As an alternative to circulator 68 a directional coupler may be used of a type known in the art.

The reflection coefficient measuring circuit is a superheterodyne system including a balanced crystal mixer 104. One input of mixer 104 is coupled through calibrated attenuator 64, and level setting attenuator 66 to the reflected signal from horn 12D. The other input of mixer 104 is coupled through calibrated attenuator 106, isolator 108, power splitter 110, wave meter 76, attenuator 74, and isolator 72 to local oscillator 70.

Power splitter 110 enables the diffraction coefficient measuring circuit to be described hereinafter to share local oscillator 70.

The output of crystal mixer 104 is coupled through I.F. amplifier 102, video detector 100 and low pass filter 98, to a CRO (cathode ray oscilloscope) 96. The reflected probe signal appears on the screen of CRO 96 and is compared with the known value of the incident probe signal from R.F. source 48 to determine the reflection coefficient R.

The diffraction coefficient measuring system is also a superheterodyne system including a balancing crystal mixer 86. One input of mixer 86 is coupled via level setting attenuator 114, and calibrated attenuator 112 horn 12B. It is by this path that the diffraction signal detected by horn 12B passes to mixer 86. The other input of mixer 86 is coupled through power splitter 110 to local oscillator 70 to provide the superheterdyning effect previously described. The output of mixer 86 is coupled through I.F. amplifier 88, video detector 90, and low pass filter 92 to CRO (cathode ray oscilloscope) 94. The diffracted signal measured by horn 12B appears on the screen of CRO 94. The diffracted signal is then compared with the incident R.F. probe signal from R.F. source 48 in order to determine the diffraction coefficient, $T_D$.

Thus, the noise power of noise source 32 can be accurately calculated from the equation described hereinbefore.

The components in the system of FIGS. 2A and 2B such as power monitors 56, 78, calibrated attentuators 58, 80, and level setting attenuator are of types known in the art and are included for the purpose of adjusting and calibrating the system as desired.

We wish it to be understood that we do not desire to be limited to the exact details of construction shown and described, for obvious modifications can be made by a person skilled in the art.

We claim:

1. A method of measuring data suitable for use in measuring noise power of a noise source under test utilizing a shock-heated gas in a gas-driven shock tube, as a primary standard, said shock tube having an observation section, and an expansion chamber comprising the steps of:
    shock-heating said gas in the expansion chamber of said shock tube to generate a shock wave therein;
    measuring the radiation generated by the shock-heated gas in said observation section with a microwave measuring system as a signal related to the noise power generated by said shock-heated gas;
    measuring a signal representative of the noise power generated by said noise source under test;
    determining the ratio of said signal representative of the noise power generated by said shock-heated gas and the signal representative of the noise power generated by said noise source under test; and
    determining the degree of impedance mismatch between the shock-heated gas in the observation section of said shock tube and the microwave measuring system;
    whereby the noise power of said noise source under test can be calculated, as a function of said ratio and said degree of mismatch.

2. The method of claim 1 wherein said degree of mismatch is determined by the steps of:
    probing the shock-heated gas in said observation section of said shock tube with a radio frequency signal directed transversely to said shock tube, a portion of said radio frequency signal being reflected by said shock-heated gas and a portion of said radio frequency signal being diffracted around said shock-heated gas;
    measuring the portion of said radio frequency signal reflected by said shock-heated gas; and
    measuring the portion of said radio frequency signal diffracted around said shock-heated gas;
    whereby said degree of mismatch is determined as a function of said reflected and diffracted radio frequency signals.

3. The method of claim 2 comprising the further steps of:
    determining the ratio between said reflected ratio frequency signal and the incident radio frequency probing signal, said ratio representing a reflection coefficient R;

determining the ratio between said diffracted radio frequency signal and the incident radio frequency probing signal, said ratio representing a diffraction coefficient $T_D$.

4. A system for measuring data suitable for use in measuring noise power of a noise source under test comprising:

a gas driven shock tube, said shock tube being used as a primary standard, said shock tube having an observation section;

means for shock-heating said test gas in said shock tube to generate a shock wave in said observation section;

microwave means for measuring the radiation generated by the shock-heated test gas in said observation section as a signal related to the noise power generated by said shock-heated gas;

means for measuring a signal representative of the noise power generated by said noise source under test;

means of determining the ratio of said signal related to the noise power generated by said shock-heated gas and the signal representative of the noise generated by said noise source under test; and means for determining the degree of impedance mismatch between the shock-heated gas in the observation section of said shock tube and the microwave measuring means;

whereby said noise power of said noise source under test is determined as a function of said ratio and said degree of mismatch, and said diffraction coefficient.

5. The system of claim 4 wherein said means for determining said degree of mismatch comprises:

means for probing said shock-heated gas in said observation section of said shock tube with a radio frequency signal directed transversely of said shock tube, a portion of said radio frequency signal being reflected by said shock-heated gas and a portion of said radio frequency signal being diffracted around said shock-heated gas;

means for measuring the portion of said radio frequency signal reflected by said shock-heated gas; and means for measuring the portion of said radio frequency signal diffracted around said shock-heated gas;

whereby said degree of mismatch is determined as a function of said reflected and diffracted radio frequency signals.

6. The system of claim 5 wherein said means for measuring said radiation generated by said shock-heated gas comprises:

a first microwave horn disposed adjacent said observation section; and a first cathode ray oscilloscope coupled through a signal path to said first microwave horn for displaying the measured radiation thereon as a pulse having a characteristic shape, width, and amplitude.

7. The system of claim 6 wherein there is further provided microwave switch means for selectively coupling said first microwave horn or said noise source under test to said first cathode ray oscilloscope to facilitate the comparison of said signal related to the noise power generated by said shock-heated gas and the signal representative of the noise power generated by the noise source under test.

8. The system of claim 7 wherein said means for determining said ratio comprises:

means for adjusting said signal representative of said noise source under test so that it appears as on said first cathode ray oscilloscope as a pulse substantially identical in shape to said characteristic shape, width, and amplitude of said pulse related to the noise power generated by said shock-heated gas.

9. The system of claim 7 wherein said means for measuring the portion of said radio frequency signal reflected from said shock-heated gas comprises:

a second microwave horn disposed adjacent said observation section; and a second cathode ray oscilloscope coupled through a signal path to said second microwave horn for displaying thereon information representative of the reflected radio frequency signal.

10. The system of claim 9 wherein said means for measuring the portion of the radio frequency signal diffracted around said shock-heated gas comprises:

a third microwave horn disposed adjacent said observation section; and a third cathode ray oscilloscope coupled through a signal path to said third microwave horn for displaying information thereon representative of the diffracted radiofrequency signal.

11. The system of claim 10 wherein there is provided in each of the signal paths between said microwave horns and the respective cathode ray oscilloscopes superheterodyne means for facilitating the measurement of low level signals.

* * * * *